United States Patent
Izumi et al.

(10) Patent No.: US 12,322,767 B2
(45) Date of Patent: *Jun. 3, 2025

(54) BATTERY MANAGEMENT SYSTEM AND BATTERY MANAGEMENT METHOD

(71) Applicant: TOYOTA JIDOSHA KABUSHIKI KAISHA, Toyota (JP)

(72) Inventors: Junta Izumi, Nagoya (JP); Kenji Kimura, Nagoya (JP); Masakazu Habu, Toyota (JP); Masanosuke Sufu, Toyota (JP); Makito Muramatsu, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 639 days.

This patent is subject to a terminal disclaimer.

(21) Appl. No.: 17/699,640

(22) Filed: Mar. 21, 2022

(65) Prior Publication Data

US 2022/0311063 A1    Sep. 29, 2022

(30) Foreign Application Priority Data

Mar. 23, 2021 (JP) ................. 2021-048293

(51) Int. Cl.
*H01M 10/44* (2006.01)
*B60L 58/10* (2019.01)
(Continued)

(52) U.S. Cl.
CPC .......... *H01M 10/441* (2013.01); *B60L 58/10* (2019.02); *G01R 31/3842* (2019.01);
(Continued)

(58) Field of Classification Search
CPC .. H01M 10/441; H01M 10/482; H01M 10/54; H01M 2010/4271; H01M 2220/10;
(Continued)

(56) References Cited

U.S. PATENT DOCUMENTS 8,996,241 B2    3/2015  Uchida
10,044,069 B2   8/2018  Despesse
(Continued)

FOREIGN PATENT DOCUMENTS

EP    2 645 515 A2    10/2013
EP    3 817 184 A1    5/2021
(Continued)

OTHER PUBLICATIONS

Oct. 1, 2024 Office Action issued in U.S. Appl. No. 17/694,776.
(Continued)

*Primary Examiner* — Paul Dinh
(74) *Attorney, Agent, or Firm* — Oliff PLC

(57) ABSTRACT

The battery cellar includes a storage cabinet that stores a plurality of batteries, an AC/DC converter and a DC/DC converter electrically connected between the plurality of used batteries stored in the storage cabinet and a power system, and a server that controls the AC/DC converter and the DC/DC converter. The server controls the AC/DC converter and the DC/DC converter in response to a demand response request from the power system, and evaluates a degradation degree of each of the plurality of used batteries based on a voltage and a current of each of the plurality of used batteries charged or discharged by the AC/DC converter and the DC/DC converter.

10 Claims, 7 Drawing Sheets

(51) Int. Cl.
    *G01R 31/3842*     (2019.01)
    *G01R 31/392*     (2019.01)
    *H01M 10/48*     (2006.01)
    *H01M 10/54*     (2006.01)

(52) U.S. Cl.
    CPC ........ *G01R 31/392* (2019.01); *H01M 10/482* (2013.01); *H01M 10/54* (2013.01); *B60L 2210/10* (2013.01); *B60L 2210/30* (2013.01)

(58) Field of Classification Search
    CPC . H01M 10/425; H01M 10/4207; B60L 58/10; B60L 2210/10; B60L 2210/30; G01R 31/3842; G01R 31/392; H02J 7/005; H02J 7/007188; H02J 7/0013; H02J 7/0029; H02J 7/0047; H02J 7/0068
    USPC .......................................................... 320/134
    See application file for complete search history.

(56) References Cited

U.S. PATENT DOCUMENTS

| | | |
|---|---|---|
| 2011/0140648 A1 | 6/2011 | Lee |
| 2012/0249057 A1 | 10/2012 | Abe et al. |
| 2013/0030739 A1 | 1/2013 | Takahashi et al. |
| 2013/0285612 A1* | 10/2013 | Okuda ................. H02J 7/0016 320/126 |
| 2015/0171641 A1 | 6/2015 | Sato |
| 2015/0349387 A1 | 12/2015 | Inaba et al. |
| 2016/0109916 A1 | 4/2016 | Li et al. |
| 2017/0205861 A1 | 7/2017 | Matsuda |
| 2017/0366023 A1* | 12/2017 | Tanaka ................ H01M 10/425 |
| 2019/0305386 A1 | 10/2019 | Lee et al. |
| 2020/0200826 A1 | 6/2020 | Izumi et al. |
| 2020/0209319 A1 | 7/2020 | Mitsui et al. |
| 2021/0168964 A1* | 6/2021 | Nakaya ................ H01M 10/48 |
| 2021/0249701 A1* | 8/2021 | Shine ................. H01M 10/465 |
| 2021/0265850 A1 | 8/2021 | Okino |
| 2022/0196753 A1* | 6/2022 | Tong .................... G01R 31/392 |
| 2022/0305925 A1 | 9/2022 | Izumi et al. |
| 2022/0308120 A1 | 9/2022 | Izumi et al. |
| 2022/0311248 A1 | 9/2022 | Izumi et al. |
| 2022/0311261 A1 | 9/2022 | Izumi et al. |

FOREIGN PATENT DOCUMENTS

| | | |
|---|---|---|
| JP | 2010-066229 A | 3/2010 |
| JP | 2013-211944 A | 10/2013 |
| JP | 2015-186290 A | 10/2015 |
| JP | 2016-117354 A | 6/2016 |
| JP | 2017-229137 A | 12/2017 |
| JP | 2018-205873 A | 12/2018 |
| WO | 2011/125213 A1 | 10/2011 |
| WO | 2013/129499 A1 | 9/2013 |
| WO | 2016/051701 A1 | 4/2016 |
| WO | 2019/181659 A1 | 9/2019 |
| WO | 2020/004053 A1 | 1/2020 |

OTHER PUBLICATIONS

Dec. 3, 2024 Office Action issued in U.S. Appl. No. 17/695,897.
Sep. 23, 2024 Office Action issued in U.S. Appl. No. 17/681,172.
Jan. 13, 2025 Notice of Allowance issued in U.S. Appl. No. 17/681,172.

* cited by examiner

| BATTERY ID | MODEL NUMBER | PRODUCTION DATE | SOC | FULL CHARGE CAPACITY | RANK | DEGRADATION EVALUATION TIME | STORAGE POSITION |
|---|---|---|---|---|---|---|---|
| | | | | | | | |
| | | | | | | | |
| | | | | | | | |
| | | | | | | | |
| ⋮ | | | | | | | |

BATTERY MANAGEMENT SYSTEM AND BATTERY MANAGEMENT METHOD

This non-provisional application is based on Japanese Patent Application No. 2021-048293 filed on Mar. 23, 2021 with the Japan Patent Office, the entire contents of which are hereby incorporated by reference.

BACKGROUND

Field

The present disclosure relates to a battery management system and a battery management method.

Description of the Background Art

Japanese Patent Laying-Open No. 2018-205873 describes that a user of a battery electric vehicle equipped with a battery suitable for an electric power storage system is prompted to replace the battery.

SUMMARY

In recent years, vehicles equipped with battery packs for driving have been spread rapidly. Therefore, the number of used batteries recovered along with the repurchase of new vehicles and the dismantling of used vehicles are increasing. Batteries are generally stored in a distribution center or the like before they are shipped out of the distribution center for subsequent use (before sold or recycled).

It is costly to properly store batteries. In addition, the batteries may be stored in the distribution center for a certain period (storage period) before they are shipped out of the distribution center for subsequent use. Therefore, it is desirable to effectively utilize the batteries during the storage period.

The present disclosure has been made in order to solve the aforementioned problems, and an object of the present disclosure is to effectively utilize batteries during a storage period.

(1) A battery management system according to a first aspect of the present disclosure includes a storage cabinet hat stores a plurality of batteries, a power converter electrically connected between the plurality of batteries stored in the storage cabinet and a power system, and a controller that controls the power converter in response to a demand response request from the power system and evaluates a degradation degree of each of the plurality of batteries based on a voltage and a current of each of the plurality of batteries charged or discharged by the power converter.

(2) The power converter performs a bidirectional power conversion operation. When the demand response request is a power increase request, the controller controls the power converter to charge the plurality of batteries, and evaluates the degradation degree of each of the plurality of batteries during the charging of the plurality of batteries. On the other hand, when the demand response request is a power decrease request, the controller controls the power converter to discharge the plurality of batteries, and evaluates the degradation degree of each of the plurality of batteries during the discharging of the plurality of batteries.

According to the configurations (1) and (2), the controller evaluates the degradation degree of each of the plurality of batteries while the plurality of batteries are being stored in the storage cabinet. Thus, it is possible to evaluate the degradation degree of each of the plurality of batteries during the storage period, which makes it possible to save time required to separately evaluate the degradation degree. Further, the controller evaluates the degradation degree of each of the plurality of batteries by charging or discharging each of the plurality of batteries in response to a demand response request from the power system, which makes it possible to obtain a payment from an administrator of the power system (generally, a power company). Therefore, according to the configurations (1) and (2), it is possible to effectively utilize the batteries during the storage period for saving time and money.

(3) The storage cabinet includes a plurality of relays, each of which electrically connects each of the plurality of batteries to or electrically disconnects each of the plurality of batteries from the power converter. Upon receipt of the demand response request, the controller controls the plurality of relays such that the plurality of batteries to be charged or discharged by the power converter include at least one of (i) a battery, the degradation degree of which is not evaluated, and (ii) a battery, the degradation degree of which has not been evaluated for a period longer than a predetermined period since a previous degradation degree evaluation.

According to the configuration (3), the plurality of batteries to be charged or discharged by the controller according to the demand response request to include at least one of a battery, the degradation degree of which is not evaluated, and a battery, the degradation degree of which has not been evaluated for a period longer than a predetermined period since a previous degradation degree evaluation. By preferentially selecting these batteries, it is possible to evaluate the degradation degree of a battery, the degradation degree of which is not evaluated, and update the evaluation result of the degradation degree to the latest state. Therefore, it is possible to improve the quality control of the batteries.

(4) The storage cabinet includes a plurality of relays, each of which electrically connects each of the plurality of batteries to or electrically disconnects each of the plurality of batteries from the power converter. Upon receipt of the demand response request, the controller controls the plurality of relays to select, from the plurality of batteries, a number of batteries to be charged or discharged so as to satisfy the demand response request.

According to the configuration (4), upon receipt of the demand response request, the controller charges or discharges the number of selected batteries so as to satisfy the demand response request. By sufficiently responding to the demand response request, it is possible to increase the payment obtained from the administrator of the power system.

(5) The controller ranks each of the plurality of batteries according to the degradation degree.

(6) The battery management system further includes a display. The controller selects, from the plurality of batteries stored in the storage cabinet, a battery having a rank satisfying the demand of a customer, and notifies an operator of the selected battery via the display.

According to the configurations (5) and (6), the controller ranks each battery, which makes it possible to set the trade price for each rank of batteries and guarantee the quality of each battery according to the rank thereof. Therefore, it is possible to smoothly distribute the batteries to the market. In addition, since it is possible to determine whether or not a battery satisfies the demand of the customer according to the rank thereof, it is easier to manage the batteries.

(7) The controller evaluates the degradation degree of each of the plurality of batteries based on the full charge capacity.

(8) A battery management method according to a second aspect of the present disclosure is a battery management method using a server, and includes a first step and a second step. The first step is a step of causing the server to charge or discharge a plurality of batteries stored in the storage cabinet in response to a demand response request from the power system. The second step is a step of causing the server to evaluate a degradation degree of each of the plurality of batteries based on a voltage and a current of each of the plurality of batteries charged or discharged in the first step.

According to the method in the configuration (8), similarly to the configuration (1), it is possible to effectively utilize the batteries during the storage period.

(9) The battery management method further includes a step of causing the server to select, from the plurality of batteries stored in the storage cabinet, a battery having a rank satisfying the demand of a customer.

According to the method in the configuration (9), since the batteries satisfying the demand of the customer may be appropriately selected and taken out of the storage cabinet, it is possible to keep a free space in the storage cabinet.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
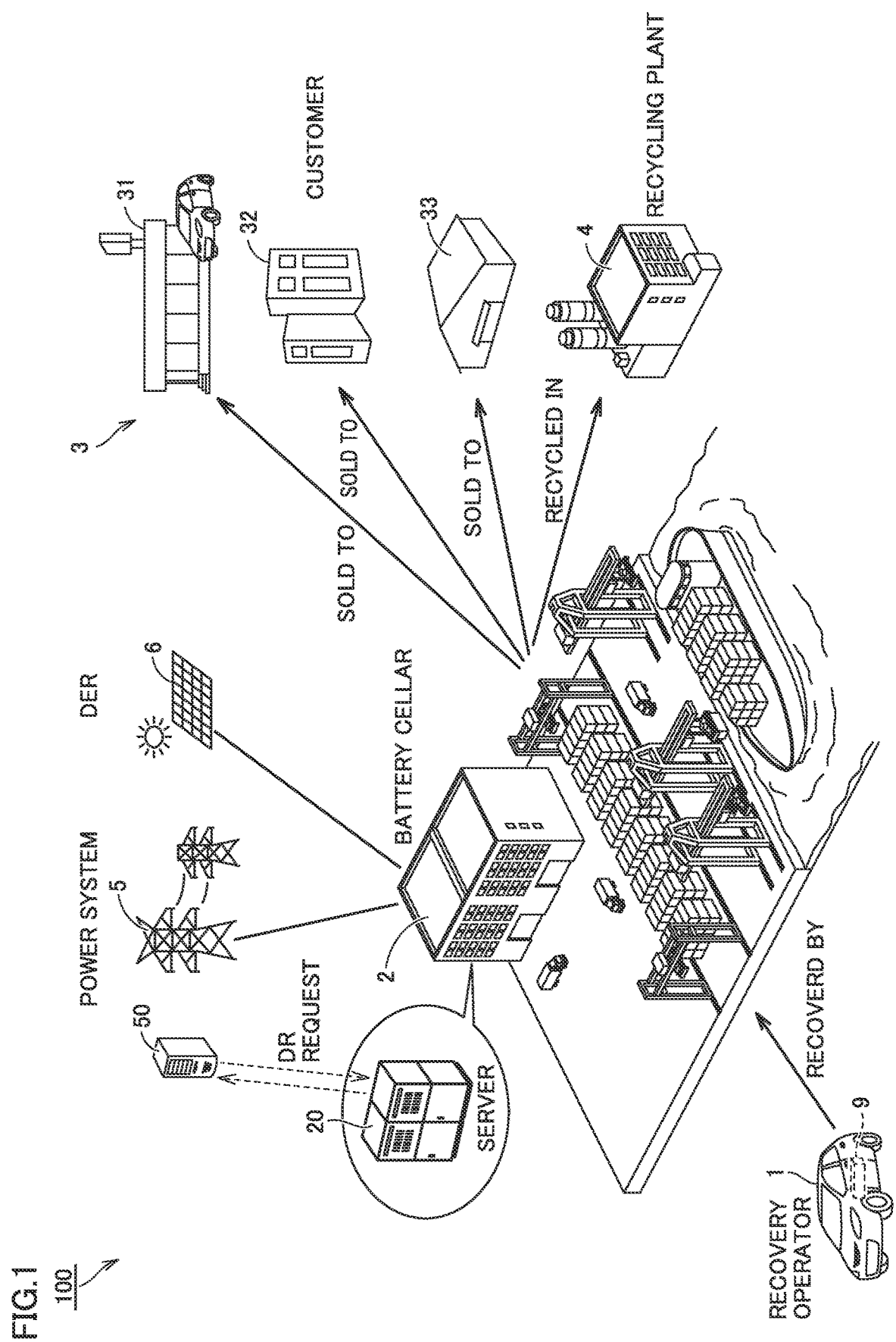
FIG. 1 is a diagram illustrating an example distribution model of a battery pack according to the present embodiment.

In the embodiments of the present disclosure, the charging/discharging of a battery means at least one of the charging or the discharging of the battery. In other words, the charging/discharging of a battery is not limited to both the charging and the discharging of the battery, it may be the charging of the battery alone or the discharging of the battery alone.

In the embodiments of the present disclosure, a battery pack includes a plurality of modules (also referred to as blocks or stacks). The plurality of modules may be connected in series or may be connected in parallel to each other. Each module includes a plurality of cells (single cells).

Generally, "recycling" of a battery pack is roughly classified into reuse, rebuild, and material recycling of the battery pack. In the case of reuse, a recovered battery pack is shipped out as it is as a reuse product after necessary inspections. In the case of rebuilt, the recovered battery pack is firstly dismantled into modules, and usable modules (modules that may be used after performance recovery) among the dismantled modules are combined to manufacture a new battery pack. The manufactured new battery pack is shipped out as a rebuilt product after necessary inspections. On the other hand, in the case of material recycling, any recyclable materials (resources) are recycled from each cell, and the recovered battery pack is not used to manufacture a new battery pack.

In the embodiments described below, the battery pack recovered from the vehicle is firstly dismantled into modules. Then, various processes are performed on each module. In other words, in the following description, a recyclable used battery means a rebuildable module. However, it is not necessary to dismantle a battery pack into modules. Depending on the configuration or the degradation degree of a battery pack, the battery pack may be reused without being dismantled into modules.

Hereinafter, embodiments of the present disclosure will be described in detail with reference to the drawings. In the drawings, the same or corresponding portions are denoted by the same reference numerals, and the description thereof will not be repeated.

Embodiments

<Battery Distribution Model>

FIG. 1 is a diagram illustrating an example distribution model of a battery pack according to the present embodiment. Hereinafter, the example distribution model illustrated in FIG. 1 will be referred to as the "battery distribution model". The battery distribution model 100 includes a recovery operator 1, a battery cellar 2, a customer 3, a recycling plant 4, a power system 5, and a distributed energy resource (DER) 6.

The recovery operator 1 recovers used battery packs (used batteries 9) from a plurality of vehicles. The recovery operator 1 may be a vehicle dealer or a vehicle dismantling operator. In the present embodiment, each used battery 9 is attached with identification information (battery ID) (see FIG. 5). Therefore, in the battery distribution model 100, the battery ID may be used to identify a used battery 9, manage data of a used battery 9 (battery data to be described later), and track a used battery 9 in the distribution path.

The battery cellar 2 is a facility for appropriately storing the used batteries 9 recovered by the recovery operator 1, which is similar to a wine cellar for storing bottles of wine under a controlled temperature and humidity. In the example illustrated in FIG. 1, the battery cellar 2 is arranged in a distribution center near a harbor. The battery cellar 2 includes a server 20 for managing data related to the used batteries 9, and a plurality of storage cabinets 21. The battery cellar 2 corresponds to the "battery management system" according to the present disclosure. The batteries stored in the battery cellar 2 are not limited to the used batteries, and may include new batteries.

Figure 2:
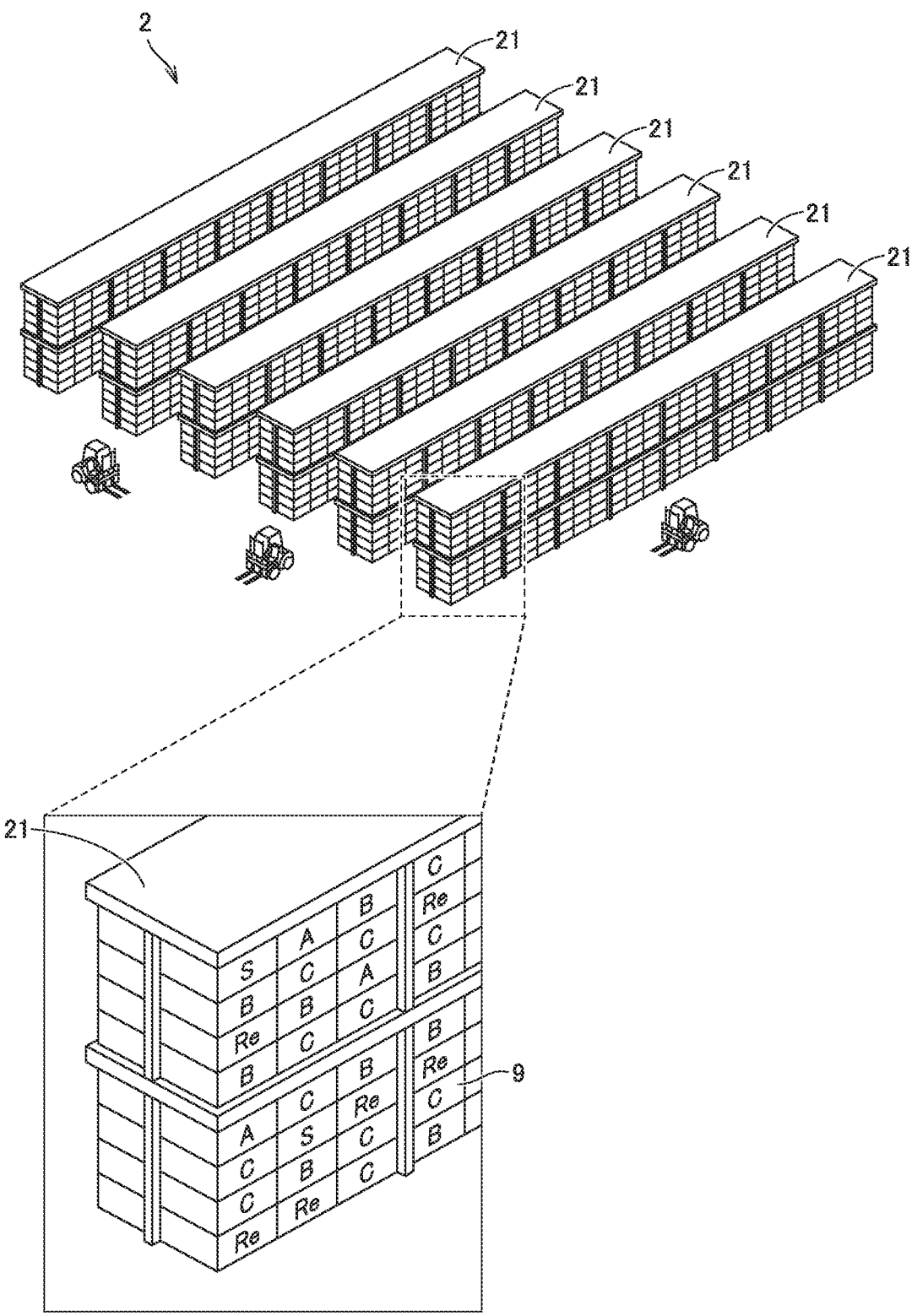
FIG. 2 is a diagram illustrating an example in which used batteries are stored in a storage cabinet.

FIG. 2 is a diagram illustrating an example in which the used batteries 9 are stored in the storage cabinet 21. As illustrated in FIG. 2, a plurality of storage cabinets 21 are arranged in a building of the battery cellar 2. Each of the plurality of storage cabinets 21 is configured to store a number of used batteries 9. Although the details will be described later, in the present embodiment, the battery cellar 2 performs a degradation evaluation test on each of the used batteries 9 stored in the storage cabinet 21. Then, based on the result of the degradation evaluation test, the battery cellar 2 determines whether each used battery 9 is recyclable or not (whether each used battery 9 is suitable for recycle or not).

Referring back to FIG. 1, the customer 3 purchases the used batteries 9 determined to be recyclable from the battery cellar 2. The customer 3 may include a vendor 31 who sells the used battery 9 as a vehicular battery, and a vendor 32 who sells the used battery 9 as a stationary battery to be used in a factory, a building or the like. Further, the customer 3 may include a vendor 33 who sells the used battery 9 as a service component (such as a maintenance or repair component).

The recycling plant 4 recycles materials of a used battery 9 which is determined to be unrecyclable by the battery cellar 2 as raw materials of another product.

The power system 5 is a power network constructed by a power plant, a power transmission and distribution facility, or the like. In the present embodiment, an electric power company serves as both a power generation company and a power transmission and distribution company. The electric power company function as a general electric power transmission and distribution operator and as an administrator who manages and maintains the power system 5. The power system 5 includes a company server 50. The company server 50 is owned by the electric power company, and is configured to manage the supply and demand of electric power of the power system 5. The server 20 and the company server 50 are configured to communicate with each other in both directions.

The DER 6 is a smaller electric power facility which is provided in a distribution center (or a peripheral area thereof) where the battery cellar 2 is arranged. The DER 6 is capable of transmitting electric power to or receiving electric power from the battery cellar 2. The DER 6 includes, for example, a power generation DER and a power storage DER.

The power generation DER may be a naturally fluctuating power source or a generator. The naturally fluctuating power source is such a power facility that the power output thereof fluctuates depending on weather conditions. Although FIG. 1 illustrates a solar power facility (a solar panel), the naturally fluctuating power source may be a wind power facility instead of or in addition to the solar power facility. On the other hand, the generator is a power facility independent of weather conditions. The generator may be a steam turbine generator, a gas turbine generator, a diesel engine generator, a gas engine generator, a biomass generator, a stationary fuel cell, or the like. The generator may be a cogeneration system that utilizes heat generated during the generation of electric power.

The storage DER may be a power storage system or a heat storage system. The power storage system is a stationary power storage device that stores electric power generated by the naturally fluctuating power source or the like. The power storage system may be a power-to-gas apparatus that uses the electrical power to produce gaseous fuels (such as hydrogen or methane). The heat storage system includes a heat storage tank provided between a heat source and a load and configured to temporarily store a liquid medium in the heat storage tank in a heated state. The heat storage system may be used to offset the heat generation and the heat consumption in time. Therefore, for example, heat generated by the heat source device by consuming the electric power during the nighttime may be stored in the heat storage tank, and the stored heat may be used to perform air conditioning during the daytime.

As described above, the used batteries 9 recovered by the recovery operator 1 are stored in the battery cellar 2 before they are shipped to the customer 3 or recycled in the recycling plant 4. Since maintenance cost (running cost) is required to appropriately store the used batteries 9 in the battery cellar 2, and the recovered used batteries 9 may be stored in the battery cellar 2 for a certain period before they are sold to the customer 3 or recycled in the recycling plant 4, it is desirable to effectively utilize the used batteries 9 stored in the battery cellar 2 during the storage period.

In the present embodiment, in addition to the storage of the used batteries 9, the battery cellar 2 functions as a virtual power plant (VPP). Thus, the charging/discharging of the used batteries 9 includes both the degradation evaluation of the used batteries 9 for determining the recycle mode of the used batteries 9 and the power supply and demand adjustment of the power system 5 using the used batteries 9. As a result, in the battery cellar 2, the storage of the used batteries 9, the degradation evaluation of the used batteries 9, and the power demand and demand adjustment using the used batteries 9 are performed in an integrated manner.

<Reuse of Battery>

Figure 3:
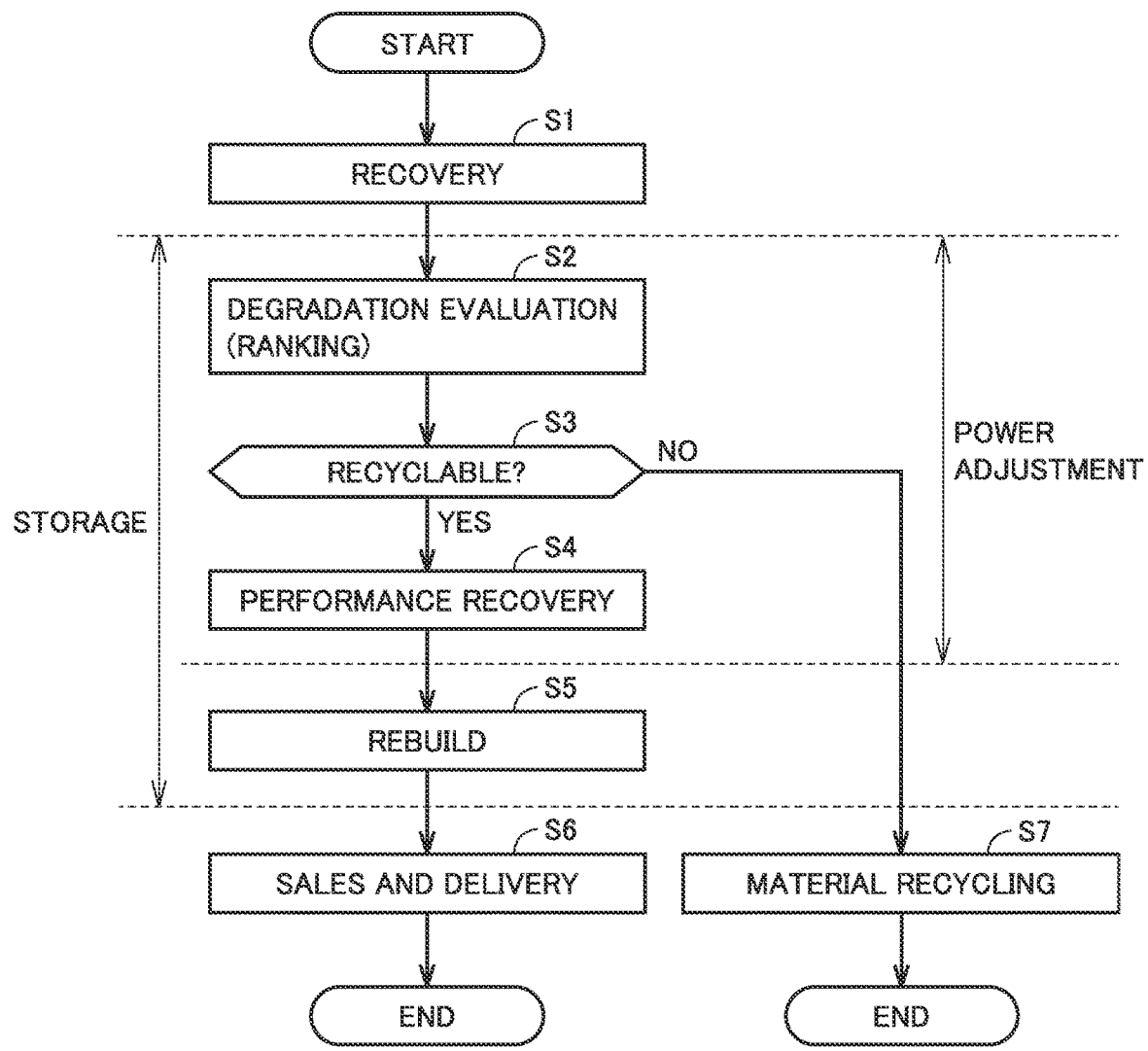
FIG. 3 is a flowchart schematically illustrating a process of recycling a used battery.

FIG. 3 is a flowchart schematically illustrating a process of recycling the used batteries 9. First, the used batteries 9 are recovered by the recovery operator 1 and delivered to the battery cellar 2 (S1).

In the present embodiment, the server 20 performs a degradation evaluation test (performance inspection) on each of the used batteries 9 stored in the storage cabinet 21 (S2). The server 20 evaluates the degradation degree of each used battery 9 based on electrical characteristics such as a full charge capacity and an internal resistance (such as an AC impedance). Then, the server 20 determines whether each used battery 9 is recyclable or not based on the result of the degradation evaluation test (S3).

If it is determined that the used battery 9 is recyclable (YES in S3), the procedure proceeds to the performance recovery step (S4). In the performance recovery step, a process (performance recovery process) is performed on the used battery 9 so as to recover the performance thereof. For example, the full charge capacity of a used battery 9 may be recovered by overcharge the used battery 9. However, the performance recovery step may be omitted. Based on the result of the degradation evaluation test, the performance recovery step may be performed on a used battery 9 which has a large degradation degree (the performance thereof is greatly reduced), whereas the performance recovery step may not be performed on a used battery 9 which has a small degradation degree (the performance thereof is not greatly reduced).

Subsequently, a new battery pack is manufactured (rebuilt) using the used batteries 9, the performance of which has been recovered in the performance recovery step (S5). The new battery pack is basically rebuilt from the used batteries 9, the performance of which has been recovered in the performance recovery step, and may include a used battery 9, the performance of which has not been recovered in the performance recovery step, or a new battery (a new module). Thereafter, the battery pack is shipped to the customer 3 (S6).

If it is determined that the used battery 9 is not recyclable based on the result of the degradation evaluation test (NO in S3), the used battery 9 is transported to the recycling plant 4 (S7). In the recycling plant 4, the used battery 9 is dismantled and materially recycled.

As described above, after the used batteries 9 are recovered by the recovery operator 1, the used batteries 9 are stored in the battery cellar 2 until they are shipped to the customer 3 or transported to the recycling plant 4. During the storage period, the degradation evaluation test is performed on each used battery 9. In order to measure the electrical characteristics such as the full charge capacity of the used battery 9 in the degradation evaluation test, the used battery 9 is charged or discharged. In the present embodiment, the electric power exchanged between the battery cellar 2 (and the DER 6) and the power system 5 is used to charge or discharge the used battery 9. Thus, the battery cellar 2 functions as a VPP (or a DER) and contributes to the load leveling of the power system 5. More specifically, during a time period when the power system 5 has a power surplus as compared with the power demand, the battery cellar 2 uses the power surplus to charge the used batteries 9 so as to absorb the power surplus. On the other hand, during a time period when the power system 5 has a power shortage as compared with the power demand, the battery cellar 2 discharges the used batteries 9 so as to compensate the power shortage.

However, the battery cellar 2 may not be configured to absorb the power surplus and compensate the power shortage of the power system 5. The battery cellar 2 may be configured to absorb the power surplus only or to compensate the power shortage only. For example, the battery cellar 2 may be configured to charge the used battery 9 with the power surplus of the power system 5, and may be configured to discharge the electric power from the used batteries 9 to a power destination different from the power system 5. The battery cellar 2 may be configured to discharge the electric power from the used batteries 9 to, for example, the DER 6 only.

<Electrical Configuration of Battery Cellar>

Figure 4:
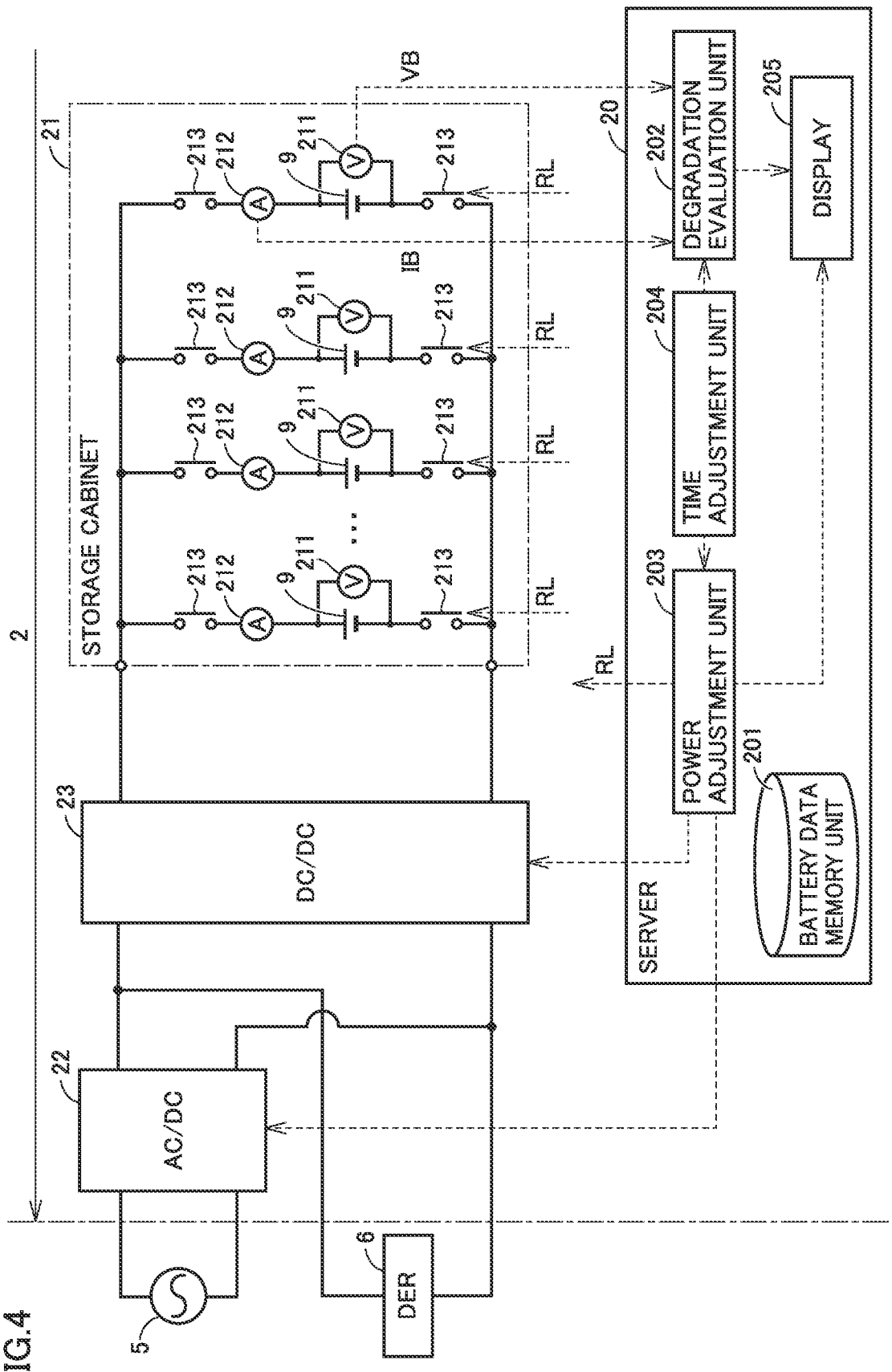
FIG. 4 is a diagram illustrating an electrical configuration of a battery cellar.

FIG. 4 is a diagram illustrating an electrical configuration of the battery cellar 2. The battery cellar 2 includes, for example, a storage cabinet 21, an AC/DC converter 22, a DC/DC converter 23, and a server 20. Although only one storage cabinet 21 is illustrated in FIG. 4 due to the limitation of paper space, a typical battery cellar 2 may include a plurality of storage cabinets 21 as illustrated in FIG. 2.

The storage cabinet 21 stores a plurality of used batteries 9. Although in FIG. 4 the plurality of used batteries 9 are connected in parallel to each other, it is merely an example, and the connection of the plurality of used batteries 9 is not particularly limited. For example, the plurality of used batteries 9 may be connected in series, or may be connected via a combination of serial connection and parallel connection. The storage cabinet 21 includes a voltage sensor 211, a current sensor 212, and a relay 213.

The voltage sensor 211 detects a voltage VB of the used battery 9, and outputs the detected voltage to the server 20. The current sensor 212 detects a current IB of the used battery 9, and outputs the detected current to the server 20. If the temperature is used in the degradation evaluation of the used battery 9, the storage cabinet 21 may further include a temperature sensor (not shown). Each sensor may be installed in each used battery 9.

The relay 213 includes, for example, a first relay electrically connected to a positive electrode of each used battery 9 and a second relay electrically connected to a negative electrode of each used battery 9. Thus, an arbitrary used battery 9 may be electrically disconnected from the power system 5 during the charging/discharging of the other used batteries 9 so as to take the used battery 9 out of the storage cabinet 21.

The AC/DC converter 22 is electrically connected between the power system 5 and the DC/DC converter 23. The AC/DC converter 22 is configured to perform a bidirectional power conversion operation so as to charge or discharge the used battery 9 stored in the storage cabinet according to a control command (charging/discharging command) from the server 20. More specifically, the AC/DC converter 22 converts AC power supplied from the power system 5 into DC power, and charges the used battery 9 with the DC power. The AC/DC converter 22 converts DC power discharged from the used battery 9 into AC power, and supplies the AC power to the power system 5.

The DC/DC converter 23 is electrically connected between the AC/DC converter 22 and the storage cabinet 21, and is also electrically connected between the DER 6 and the storage cabinet 21. Similar to the AC/DC converter 22, the DC/DC converter 23 is configured to perform a bidirectional power conversion operation according to a control command (charging/discharging command) from the server 20. The DC/DC converter 23 may charge the used battery 9 with the DC power supplied from the AC/DC converter 22 and/or the DER 6, and may discharge the DC power stored in the used battery 9 to the AC/DC converter 22 and/or the DER 6.

The server 20 includes a processor such as a CPU (Central Processing Unit), a memory such as a ROM (Read Only Memory) and a RAM (Random Access Memory), and input/output ports (none of which is shown) through which various signals are input/output. The server 20 performs various controls based on signals received from the sensors as well as programs and maps stored in the memory. The server 20 includes a battery data memory unit 201, a degradation evaluation unit 202, a power adjustment unit 203, a time adjustment unit 204, and a display 205.

The battery data memory unit 201 stores battery data to be used for managing the used batteries 9 in the battery cellar 2.

Figures 5, 6:
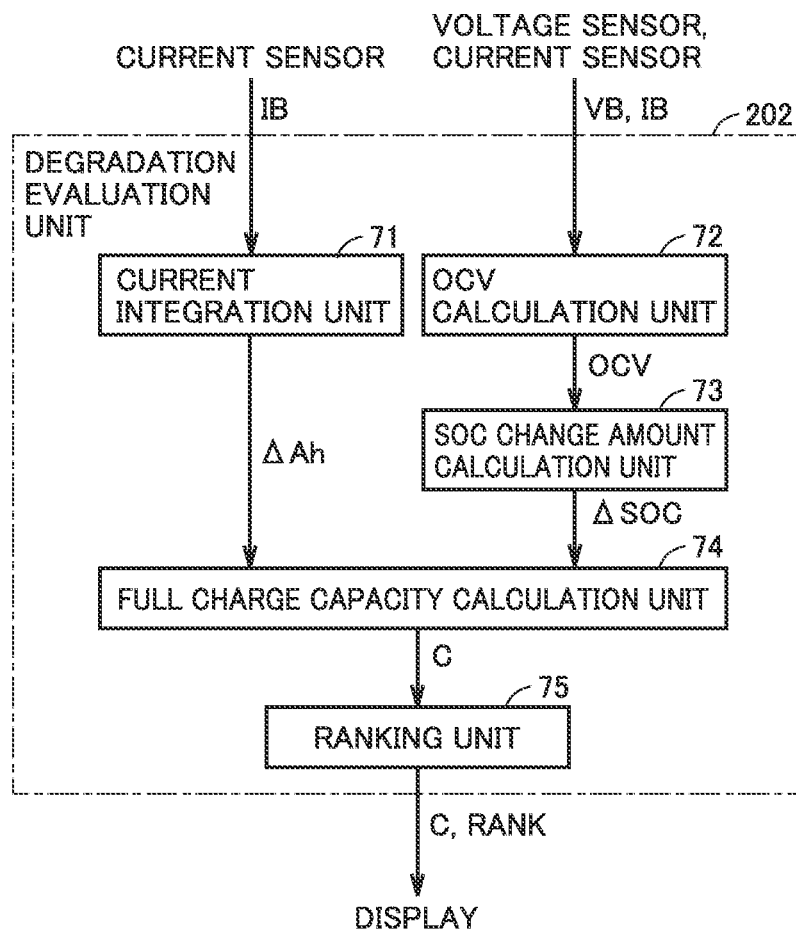
FIG. 5 is a diagram illustrating an example data structure of a battery.
FIG. 6 is a functional block diagram illustrating a server which evaluates the degradation of a used battery.

FIG. 5 is a diagram illustrating an example data structure of a used battery 9. The battery data is stored in the format of a map, for example. The battery data includes, as parameters, for example, identification information (battery ID) for identifying the used battery 9, a model number of the used battery 9, a production date, a current SOC (State Of Charge), a full charge capacity, a rank, a degradation evaluation time (the latest time at which the degradation evaluation test is performed), and a storage position (identification information of a storage cabinet in which the used battery 9 is stored). The battery data may include other parameters than those mentioned above, such as an internal resistance of the used battery 9, or an index $\Sigma D$ indicating the deviation of salt concentration distribution in the electrolytic solution of the used battery 9.

Referring again to FIG. 4, the degradation evaluation unit 202 performs a degradation evaluation test on each used battery 9 based on the voltage VB detected by the voltage sensor 211 and the current IB detected by the current sensor 212 during the charging/discharging of the used battery 9. An example evaluation method will be described with reference to FIG. 6.

The power adjustment unit 203 adjusts the electric power exchanged between the battery cellar 2 (and the DER 6) and the power system 5. More specifically, the server 20 selects a used battery 9 to be charged or discharged from the plurality of used batteries 9 according to a demand response (DR) request from the company server 50 (see FIG. 1). In order to charge or discharge the selected used battery 9, the power adjustment unit 203 sends a command to the relay 213, the AC/DC converter 22 and the DC/DC converter 23. An example control method will be described with reference to FIG. 7.

The time adjustment unit 204 adjusts a time at which the degradation evaluation unit 202 performs a degradation evaluation test on a used battery 9 and a time at which the power adjustment unit 203 adjusts the electric power exchanged between the battery cellar 2 and the power system 5. More specifically, the time adjustment unit 204 performs the time adjustment so that the degradation evaluation test of the used battery 9 is performed at a time in synchronization with the time at which the used battery 9 in the battery cellar 2 is charged or discharged in response to the DR request from the company server 50. In addition to the degradation evaluation test, the performance recovery process (see S4 in FIG. 3) may be performed at a time in synchronization with the time at which the used battery 9 in the battery cellar 2 is charged or discharged in response to the DR request from the company server 50.

The display 205 displays the battery data (see FIG. 5) in response to an instruction from an administrator of the battery cellar 2 (or an employee of the battery cellar 2). The display 205 also displays the progress and results of the degradation evaluation test performed by the degradation evaluation unit 202. Thus, the administrator may understand the progress and results of the degradation evaluation test. Further, the display 205 displays the charging/discharging conditions of the used battery 9 selected by the power adjustment unit 203. Thus, the administrator may understand the result of the power adjustment between the battery cellar 2 and the power system 5.

The server 20 corresponds to the "controller" according to the present disclosure. The AC/DC converter 22 and the DC/DC converter 23 correspond to the "power converter" according to the present disclosure.

<Degradation Evaluation>

FIG. 6 is a functional block diagram illustrating the server 20 (the degradation evaluation unit 202) which evaluates the degradation of the used batteries 9. Hereinafter, for the sake of simplification, the description will be carried out on a single used battery 9. In fact, when a plurality of used batteries 9 are waiting for the degradation evaluation, the degradation evaluation may be performed simultaneously on the plurality of used batteries 9. The degradation evaluation unit 202 includes a current integration unit 71, an open circuit voltage (OCV) calculation unit 72, an SOC change amount calculation unit 73, a full charge capacity calculation unit 74, and a ranking unit 75.

The current integration unit 71, based on the current IB detected by the current sensor 212, calculates an integrated value (integrated current) ΔAh (unit: Ah) of a current charged to or discharged from the used battery 9 during a period from a time when the start condition of current integration is satisfied to a time when the end condition of current integration is satisfied. As described above in the present embodiment, the charging/discharging of the used battery 9 is performed in response to the DR request from the company server 50, and the current flowing through the used battery 9 is integrated during the charging/discharging. More specifically, in the case of an increase DR request (power increase request), the used battery 9 is charged so as to increase the power demand of the battery cellar 2, and the charge current is integrated during the charging. On the other hand, in the case of a decrease DR request (power decrease request), the used battery 9 is discharged so as to reduce the power demand of the battery cellar 2, and the discharge current is integrated during the discharging. The current integration unit 71 outputs the integrated current ΔAh to the full charge capacity calculation unit 74. The increase DR request corresponds to a "power increase request" in the present disclosure, and the decrease DR request corresponds to a "power decrease request" in the present disclosure.

The OCV calculation unit 72 calculates an OCV of the used battery 9 at the start of current integration and an OCV of the used battery 9 at the end of current integration. The OCV may be calculated according to the following expression (1), for example.

$$OCV = VB - \Delta Vp - IB \times R \quad (1)$$

In the expression (1), R represents an internal resistance of the used battery 9, and Vp represents a polarization voltage. At the start of current integration (immediately before the start of charging/discharging), the current IB=0. Further, before the start of current integration when the used battery 9 is not charged or discharged, the polarization voltage Vp≅0. Therefore, the OCV at the start of current integration may be calculated based on the voltage VB detected by the voltage sensor 211. The internal resistance R may be determined according to the relationship between the voltage VB and the current IB (the Ohm's law). When the charging/discharging of the used battery 9 is performed at a constant current, since the relationship between the current IB and the polarization voltage Vp may be measured in advance, the polarization voltage Vp may be determined from the current IB detected by the current sensor 212. Therefore, the OCV of the used battery 9 at the end of current integration may be calculated based on the voltage VB and the current IB. The OCV calculation unit 72 outputs the two calculated OCVs, i.e., the calculated OCV of the used battery 9 at the start of current integration and the calculated OCV of the used battery 9 at the end of current integration, to the SOC change amount calculation unit 73.

The SOC change amount calculation unit 73 calculates the SOC change amount ΔSOC of the used battery 9 from the start of current integration to the end of current integration based on the two calculated OCVs. A characteristic curve (OCV-SOC curve) indicating a relationship between the OCV and the SOC is preliminarily stored in the SOC change amount calculation unit 73. Thus, the SOC change amount calculation unit 73 reads an SOC corresponding to the OCV at the start of current integration and an SOC corresponding to the OCV at the end of current integration by referring to the OCV-SOC curve, and calculates the difference between the two SOCs as ΔSOC. The SOC change amount calculation unit 73 outputs the calculated ΔSOC to the full charge capacity calculation unit 74.

The full charge capacity calculation unit 74 calculates a full charge capacity C of the used battery 9 based on the ΔAh obtained from the current integration unit 71 and the ΔSOC obtained from the SOC change amount calculation unit 73. More specifically, the full charge capacity C of the used battery 9 may be calculated according to the following expression (2). Since an initial full charge capacity C0 may be obtained from the specifications of the used battery 9, the full charge capacity calculation unit 74 may calculate a capacity retention rate Q from the full charge capacity C and the initial full charge capacity C0 (Q=C/C0). The full charge capacity calculation unit 74 outputs the calculated full charge capacity C to the ranking unit 75.

$$C = \Delta Ah / \Delta SOC \times 100 \quad (2)$$

The ranking unit 75 ranks each used battery 9 according to the full charge capacity C. In the present embodiment, as illustrated in FIG. 2, the used batteries 9 that may be rebuilt are ranked in the descending order of the full charge capacity into four ranks: rank S, rank A, rank B, and rank C. On the other hand, a used battery 9, the full charge capacity of which is less than a prescribed value, is ranked with a rank (represented as Re) lower than rank C, and is transported to the material recycling. The ranking unit 75 may record the time where a used battery is ranked as the degradation evaluation time in the battery data (see FIG. 5).

The rank of the used battery 9 is displayed on the display 205 together with the battery ID, the storage position of the used battery 9 and the like. As a result, when a request to purchase the used battery 9 is received from the customer 3, an operator of the battery cellar 2 may select and take out a used battery 9 having a rank corresponding to the request of the customer 3 from the storage position. By appropriately taking out the used batteries that have been sold from the storage cabinet 21, it is possible to keep a free space in the storage cabinet 21.

The method of calculating the full charge capacity C is merely an example. Any method may be employed to calculate the full charge capacity C as long as the method uses the voltage VB and the current IB detected during the charging/discharging of the used battery 9. Instead of or in addition to the full charge capacity C, the ranking unit 75 may rank a used battery 9 based on another characteristics (such as the internal resistance R of a used battery 9 or the index $\Sigma D$ indicating the deviation of the electrolytic solution concentration in a lithium ion battery). The ranking unit 75 may rank a used battery 9 based on the length of time during which the used battery 9 is charged or discharged and/or the number of times the used battery 9 is charged or discharged. The ranking unit 75 may rank a used battery 9 based on the elapsed time from the production of the used battery 9, although the determined rank may not be sufficiently accurate. The ranking unit 75 may rank a used battery 9 based on a combination of the factors mentioned above (such as the full charge capacity C, the internal resistance R, the index $\Sigma D$, the charging/discharging time, the number of charging/discharging times, the elapsed time from the production).

<Power Adjustment>

FIG. 13 is a functional block diagram illustrating the server 20 (the power adjustment unit 203) which adjusts the electric power exchanged between the battery cellar 2 and the power system 5. In the present embodiment, for the sake of easy understanding, the description is carried out on the assumption that the DER 6 is a power generation DER (in particular, a naturally fluctuating power source such as a solar power facility). The power adjustment unit 203 includes a total adjustment amount calculation unit 81, a DER adjustment amount calculation unit 82, a battery cellar adjustment amount calculation unit 83, a used battery selection unit 84, a conversion calculation unit 85, and a command generation unit 86.

Upon receipt of a DR request from the company server 50, the total adjustment amount calculation unit 81 calculates a total amount of electric power that is required by the battery cellar 2 and the DER 6 to perform the power adjustment during a predetermined period (for example, 30 minutes). This amount of electric power is hereinafter referred to as the total adjustment amount, and is denoted as kWh (total). The total adjustment amount calculation unit 81 outputs the calculated kWh (total) to the battery cellar adjustment amount calculation unit 83.

The DER adjustment amount calculation unit 82 acquires the operating state of each DER 6 (more specifically, the expected amount of electric power generated by each DER 6 during a predetermined period) through the communication with the DER 6. This amount of electric power is hereinafter referred to as the DER adjustment amount, and is denoted as kWh (DER). The DER adjustment amount calculation unit 82 outputs the acquired kWh (DER) to the battery cellar adjustment amount calculation unit 83.

Based on the kWh (total) obtained from the total adjustment amount calculation unit 81 and the kWh (DER) obtained from the DER adjustment amount calculation unit 82, the battery cellar adjustment amount calculation unit 83 calculates the amount of electric power required by the battery cellar 2 to perform the power adjustment. This amount of electric power is hereinafter referred to as the battery cellar adjustment amount, and is denoted as kWh (bat). The battery cellar adjustment amount calculation unit 83 calculates the difference between the two amounts of power, i.e., $\Delta$kWh=kWh (total)−kWh (DER), as the battery cellar adjustment amount kWh (bat). The battery cellar adjustment amount calculation unit 83 outputs the calculated kWh (bat) to the used battery selection unit 84.

The used battery selection unit 84 obtains an amount of electric power that may be charged to or discharged from each of the plurality of used batteries 9 stored in the plurality of storage cabinets 21 (see the battery data in FIG. 5). The used battery selection unit 84 selects a used battery from the plurality of the used batteries 9 to perform the power adjustment based on the kWh (bat) obtained from the battery cellar adjustment amount calculation unit 83. When kWh (bat)>0, the power shortage of the power system 5 is compensated by the electric power discharged from the used batteries in the battery cellar 2. Therefore, the used battery selection unit 84 selects a number of used batteries 9 capable of discharge an amount of electric power equal to or greater than the kWh (bat). On the other hand, when kWh (bat)<0, the power surplus of the power system 5 is absorbed by charging the used batteries in the battery cellar 2. Therefore, the used battery selection unit 84 selects a number of used batteries 9 that may be charged with an amount of electric power equal to or greater than the kWh (bat) (absolute value). The used battery selection unit 84 outputs the selected used batteries 9 and the amount of electric power assigned to each of the selected used batteries 9 (the amount of electric power that may be adjusted by each used battery 9) to the conversion calculation unit 85.

The conversion calculation unit 85 calculates the electric power to be charged to or discharged from each used battery 9 selected by the used battery selection unit 84. More specifically, the conversion calculation unit 85, based on the remaining time of the power adjustment, converts the amount of electric power (unit: kWh) which may be adjusted by using the used battery 9 into the electric power (unit: kW) for each used battery 9. For example, when the power adjustment amount assigned to a used battery 9 is 10 kWh, and the remaining time of the power adjustment is 15 minutes (0.25 h), the electric power may be calculated as 40 kW (=10 kWh/0.25 h). The conversion calculation unit 85 outputs the electric power to be charged to or discharged from each used battery 9 to the command generation unit 86.

The command generation unit 86, based on the calculation result obtained from the conversion calculation unit 85, generates a charging/discharging command to the AC/DC converter 22 and the DC/DC converter 23, and generates an open/close command to the relay 213. More specifically, the command generation unit 86 generates an open/close command so as to electrically connect the selected used batteries 9 to the DC/DC converter 23 and electrically disconnect the unselected used batteries 9 from the DC/DC converter 23. The command generation unit 86 generates the charging/ discharging command so as to charge a total amount of electric power to the selected used batteries 9 or discharge the total amount of electric power from the selected used batteries 9.

Figure 7:
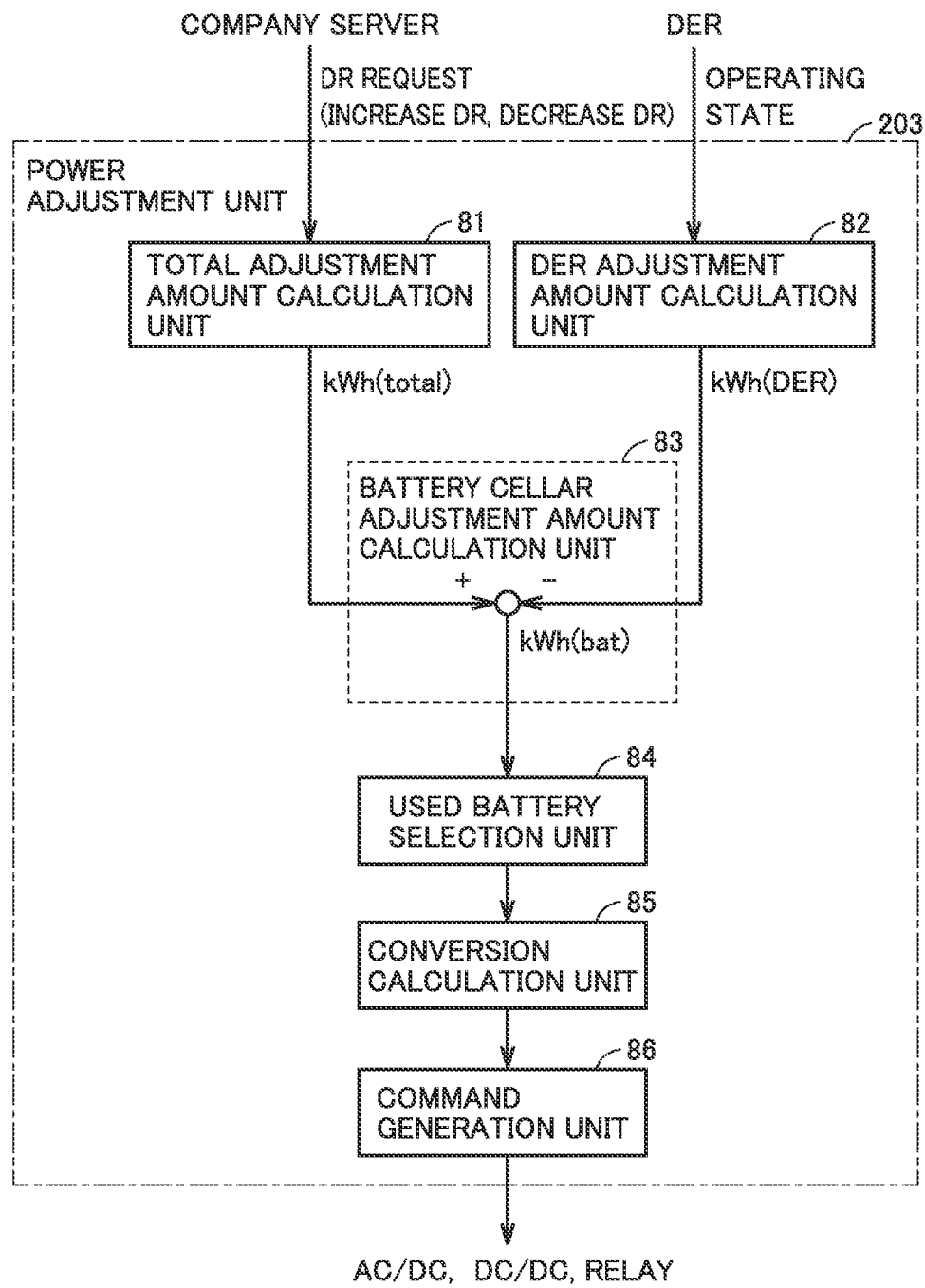
FIG. 7 is a functional block diagram illustrating a server which adjusts the electric power exchanged between a battery cellar and a power system.

Note that the power adjustment method illustrated in FIG. 7 is merely an example. In the present embodiment, it is assumed that the DER 6 is a power generation DER, and specifically a naturally fluctuating power source, the power output of which cannot be controlled. Therefore, the battery cellar adjustment amount calculation unit 83 calculates the battery cellar adjustment amount kWh (bat) as the difference [kWh (total)−kWh (DER)] between the total adjustment amount kWh (total) and the DER adjustment amount kWh (DER). In other words, in the present embodiment, after the DER adjustment amount kWh (DER) is determined, the final power adjustment is performed by using the battery cellar adjustment amount kWh (bat). However, for example, when the DER 6 is a storage DER, the battery cellar adjustment amount calculation unit 83 may assign the total adjustment amount kWh (total) to the DER adjustment amount kWh (DER) and the battery cellar adjustment amount kWh (bat), and perform the power adjustment using both the DER adjustment amount kWh (DER) and the battery cellar adjustment amount kWh (bat).

As described above in the present embodiment, the degradation degree of each used battery 9 stored in the storage cabinet 21 is evaluated. This eliminates the need to separately evaluate the degradation degree of the used battery 9 after being taken out of the storage cabinet 21, which makes it possible to effectively utilize the used battery 9 during the storage period for saving time. Further, the charging/discharging of the used battery 9 for evaluating the degradation degree of each used battery 9 is basically performed in response to a DR request from the company server 50. When the number of the used batteries 9 is large, a large amount of electric power is charged or discharged, and the large amount of electric power is exchanged between the battery cellar 2 and the power system 5 in response to a DR request from the company server 50. Thus, the operator of the battery cellar 2 may receive a payment (an incentive) from the power company, and may use the payment as the running cost to run the battery cellar 2. Alternatively, the operator of the battery cellar 2 may recover a part of the initial investment (initial cost) of the battery cellar 2. Thus, it is possible to effectively utilize the used batteries 9 during the storage period for saving money.

In the present embodiment, each used battery 9 is ranked based on the result of the degradation evaluation test (the full charge capacity). Thus, when rebuilding a used battery 9, the trade price of each used battery 9 may be determined in association with the rank thereof, and the quality of each used battery 9 may be guaranteed in association with the rank thereof. Therefore, the used batteries 9 may be smoothly distributed from the battery cellar 2 to the market.

<Preferential Selection of Used Battery>

As to be described hereinafter, when the server 20 (the used battery selection unit 84) selects, from the plurality of used batteries 9, a used battery in response to the increase DR request or the decrease DR request, it is preferable to preferentially select a specific used battery 9 over the other used batteries.

Figure 8:
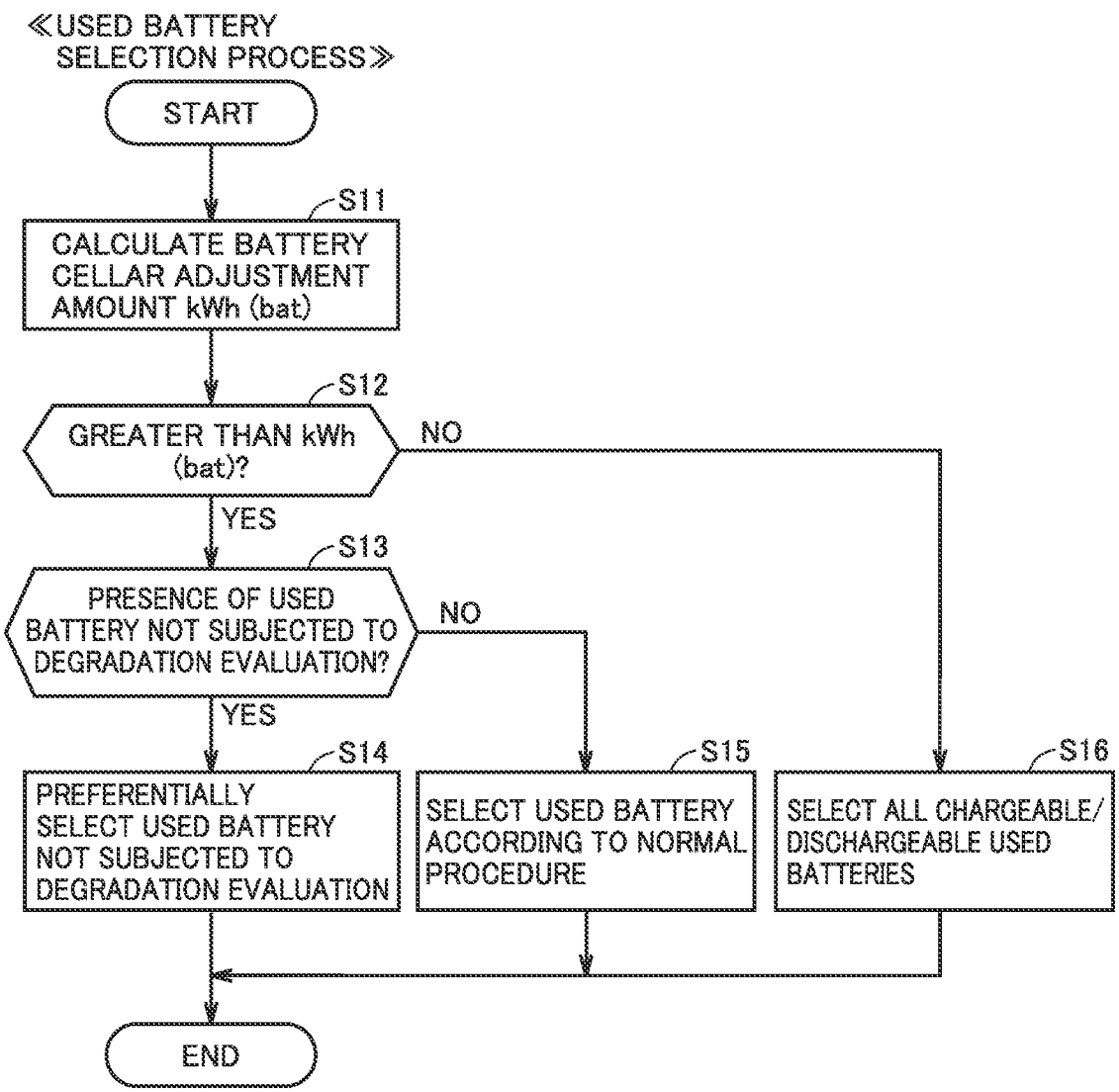
FIG. 8 is a flowchart illustrating a selection process of a used battery.

FIG. 8 is a flowchart illustrating a selection process of the used batteries 9. This flowchart (and other flowcharts to be described later) is invoked from a main routine (not shown) and executed when a predetermined condition is satisfied. Each step is implemented by software installed the server 20, but it may be implemented by hardware (electrical circuits) arranged in the server 20. Hereinafter, the term of "step" is abbreviated as S.

In S11, the server 20 calculates the battery cellar adjustment amount kWh (bat). Since the calculation method has been described in detail with reference to FIG. 7, the description thereof will not be repeated.

In S12, the server 20 determines whether or not the total amount of electric power that may be charged to or discharged from all the used batteries 9 has a power surplus as compared with the battery cellar adjustment amount kWh (bat). If there is no power surplus, in other words, if the battery cellar adjustment amount kWh (bat) is greater than the total amount of electric power that may be charged to or discharged from all the selectable used batteries 9 (NO in S12), in order to approximate the amount of electric power that may be charged to or discharged from the battery cellar 2 to the battery cellar adjustment amount ΔkWh (bat), it is required to charge or discharge all the selectable used batteries 9. Accordingly, the server 20 selects all the used batteries 9 (S16).

On the other hand, if there is a power surplus, in other words, if it is possible to obtain the battery cellar adjustment amount ΔkWh (bat) without charging or discharging all the selectable used batteries 9 (YES in S12), the server 20 determines whether or not there is a used battery 9, the degradation evaluation test of which is not performed, or a used battery 9, the degradation evaluation test of which has not been performed for a period longer than a predetermined period since the previous degradation evaluation time in the selectable used batteries 9 (S13). The server 20 may determine that the degradation evaluation test has not been performed on a used battery 9 if the used battery is not ranked. Further, the server 20 may calculate the period from the previous degradation evaluation time based on the battery data (see FIG. 5).

If there is a used battery 9, the degradation evaluation test of which is not performed (YES in S13), the server 20 preferentially selects the used battery 9, the degradation evaluation test of which is not performed (S14). More specifically, the server 20 firstly selects the used batteries 9, the degradation evaluation test of which is not performed, and if the used batteries 9, the degradation evaluation test of which is not performed, cannot produce the battery cellar adjustment amount ΔkWh (bat), the server 20 further selects the used batteries 9, the degradation evaluation test of which has been performed.

If there is no used battery 9, the degradation evaluation test of which is not performed (NO in S13), the server 20 selects the used batteries 9 according to a normal procedure (S15). For example, a used battery 9 which is approximately fully charged is likely to degrade faster than a used battery 9 which is not fully charged. On the other hand, a used battery 9, the SOC of which is excessively low, is likely to degrade faster than a used battery 9, the SOC of which is not excessively low. Therefore, the used batteries 9, the SOC of which is within a range in which the used battery degrades faster, may be selected, and the selected used batteries 9 may be charged or discharged so as to keep the SOC of each used battery 9 out of the aforementioned range.

As described above, in the example illustrated in FIG. 8, the charging/discharging is performed for power adjustment by preferentially selecting a used battery 9, the degradation evaluation test of which is not performed, or a used battery 9, the degradation evaluation test of which has not been performed for a period longer than a predetermined period elapsed from the previous degradation evaluation time. By preferentially selecting a used battery 9, the degradation evaluation test of which is not performed and thereby is unranked, it is possible to rank the used battery 9. In general, a battery degrades over time. Therefore, although a used battery 9 has already been ranked but a long period has elapsed from the previous degradation evaluation time, the rank of the used battery 9 may be updated with the latest degradation degree. Thus, it is possible to improve the quality management of the used batteries 9 in the battery cellar 2.

Although the embodiments of the present disclosure have been described as above, it should be understood that the embodiments disclosed herein are illustrative and non-restrictive in every respect. The scope of the present disclosure is defined by the terms of the claims, and is intended to include any modifications within the meaning and scope equivalent to the terms of the claims.

What is claimed is:

1. A battery management system comprising:
   a storage cabinet that stores a plurality of batteries;
   a power converter electrically connected between the plurality of batteries stored in the storage cabinet and a power system and performs a bidirectional power conversion operation; and
   a controller that controls the power converter in response to a demand response (DR) request from the power system so at to make the battery management system function as a virtual power plant (VPP), and evaluates a full charge capacity or an internal resistance of each of the plurality of batteries based on a voltage and a current of each of the plurality of batteries charged or discharged by the power converter, wherein
   when the DR request is a power increase request, the controller controls the power converter to charge the plurality of batteries, and evaluates the full charge capacity or the internal resistance based on the voltage and the current obtained during the charging performed in response to the power increase request, and
   when the DR request is a power decrease request, the controller controls the power converter to discharge the plurality of batteries and evaluates the full charge capacity or the internal resistance based on the voltage and the current obtained during the discharging performed in response to the power decrease request.

2. The battery management system according to claim 1, wherein
   the storage cabinet includes a plurality of relays, each of which electrically connects each of the plurality of batteries to or electrically disconnects each of the plurality of batteries from the power converter, and
   upon receipt of the DR request, the controller controls the plurality of relays such that the plurality of batteries to be charged or discharged by the power converter include at least one of (i) a battery, the full charge capacity or the internal resistance of which is not evaluated, and (ii) a battery, the full charge capacity or the internal resistance of which has not been evaluated for a period longer than a predetermined period since a previous degradation degree evaluation.

3. The battery management system according to claim 1, wherein
   the storage cabinet includes a plurality of relays, each of which electrically connects each of the plurality of batteries to or electrically disconnects each of the plurality of batteries from the power converter, and
   upon receipt of the DR request, the controller controls the plurality of relays to select, from the plurality of batteries, a number of batteries to be charged or discharged so as to satisfy the DR request.

4. The battery management system according to claim 1, wherein
   the controller ranks each of the plurality of batteries according to the full charge capacity or the internal resistance.

5. The battery management system according to claim 4, further comprising a display, wherein
   the controller selects, from the plurality of batteries stored in the storage cabinet, a battery having a rank satisfying a demand of a customer, and notifies an operator of the selected battery via the display.

6. The battery management system according to claim 1, wherein
   the controller evaluates the full charge capacity or the internal resistance of each of the plurality of batteries based on a full charge capacity.

7. The battery management system according to claim 1, wherein
   the controller performs a time adjustment so that the evaluation of the full charge capacity or the internal resistance is performed at a time in synchronization with the time at which the plurality of batteries are charged or discharged in response to the DR request.

8. A battery management method using a server, comprising:
   causing the server to charge or discharge a plurality of batteries stored in a storage cabinet in response to a demand response (DR) request from a power system; and
   causing the server to evaluate a full charge capacity or an internal resistance of each of the plurality of batteries based on a voltage and a current of each of the plurality of batteries charged or discharged in the former step, wherein
   causing the server to evaluate the full charge capacity or the internal resistance includes:
   when the DR request is a power increase request, causing the server to charge the plurality of batteries and evaluate the full charge capacity or the internal resistance based on the voltage and the current obtained during the charging performed in response to the power increase request, and
   when the DR request is a power decrease request, causing the server to discharge the plurality of batteries and evaluate the full charge capacity or the internal resistance based on the voltage and the current obtained during the discharging performed in response to the power decrease request.

9. The battery management method according to claim 8, further comprising:
   causing the server to select, from the plurality of batteries stored in the storage cabinet, a battery having a rank satisfying a demand of a customer.

10. The battery management method according to claim 8, further comprising:
    performing a time adjustment so that the evaluation of the full charge capacity or the internal resistance is performed at a time in synchronization with the time at which the plurality of batteries are charged or discharged in response to the DR request.

* * * * *